United States Patent
Sun

(10) Patent No.: US 11,121,179 B2
(45) Date of Patent: Sep. 14, 2021

(54) VARIABLE RESISTANCE MEMORY DEVICES

(71) Applicant: Samsung Electronics Co., Ltd., Suwon-si (KR)

(72) Inventor: Chang-Woo Sun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 291 days.

(21) Appl. No.: 16/377,200

(22) Filed: Apr. 6, 2019

(65) Prior Publication Data

US 2020/0119095 A1   Apr. 16, 2020

(30) Foreign Application Priority Data

Oct. 11, 2018  (KR) .................. 10-2018-0120935

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/1233* (2013.01); *H01L 45/1253* (2013.01); *H01L 45/144* (2013.01)

(58) Field of Classification Search
None
See application file for complete search history.

(56) References Cited

U.S. PATENT DOCUMENTS

| | | | |
|---|---|---|---|
| 9,543,512 B2 | 1/2017 | Ohba et al. | |
| 9,620,711 B2 | 4/2017 | Lee | |
| 9,698,344 B2 | 7/2017 | Kau | |
| 9,704,921 B2 | 7/2017 | Kim et al. | |
| 2016/0336378 A1 | 11/2016 | Ohba et al. | |
| 2017/0200768 A1* | 7/2017 | Park .................. | H01L 45/126 |
| 2017/0250339 A1* | 8/2017 | Sim .................. | H01L 27/2481 |
| 2017/0309818 A1 | 10/2017 | Chan et al. | |
| 2018/0047899 A1 | 2/2018 | Horii et al. | |

\* cited by examiner

*Primary Examiner* — Joseph C. Nicely
*Assistant Examiner* — Lamont B Koo
(74) *Attorney, Agent, or Firm* — Muir Patent Law, PLLC

(57) ABSTRACT

A variable resistance memory device may include a plurality of stacked structures. Each of the stacked structures may be formed on a substrate, and may include a lower electrode, a variable resistance pattern and a selection pattern sequentially stacked. A threshold voltage control pattern may be formed on the stacked structures, may extend in a second direction parallel to an upper surface of the substrate and may be configured to either increase or decrease a threshold voltage of each selection pattern. An upper electrode may be formed on the threshold voltage control pattern and may extend in the second direction. A first conductive line may contact respective lower surfaces of the lower electrodes of the stacked structures and extend in a first direction perpendicular to the second direction. A second conductive line may contact an upper surface of the upper electrode and extend in the second direction.

20 Claims, 17 Drawing Sheets

FIRST DIRECTION
SECOND DIRECTION

VARIABLE RESISTANCE MEMORY DEVICES

CROSS-REFERENCE TO RELATED APPLICATION

This application claims priority under 35 U.S.C. § 119 to Korean Patent Application No. 10-2018-0120935, filed on Oct. 11, 2018 in the Korean Intellectual Property Office (KIPO), the contents of which are herein incorporated by reference in their entirety.

BACKGROUND

1. Field

Example embodiments relate to a variable resistance memory device and a method of manufacturing the same. More particularly, example embodiments relate to a variable resistance memory device including a selection pattern serving as a switching device.

2. Description of the Related Art

A unit cell of the variable resistance memory device may include a selection pattern. A switching characteristic of the selection pattern may be controlled so that the selection pattern may have a target threshold voltage. However, the target threshold voltage of the selection pattern may typically be difficult to be controlled.

SUMMARY

Example embodiments provide a variable resistance memory device including a selection pattern having a target threshold voltage.

According to example embodiments, there is provided a variable resistance memory device. The variable resistance memory device may include a plurality of stacked structures. Each of the stacked structures may be formed on a substrate, and may include a lower electrode, a variable resistance pattern on the lower electrode, a middle electrode on the variable resistance pattern and a selection pattern on the middle electrode. A threshold voltage control pattern may be formed on the stacked structures and may extend in a second direction parallel to an upper surface of the substrate. The threshold voltage control pattern may be configured to either increase or decrease a threshold voltage of each selection pattern. An upper electrode may be formed on the threshold voltage control pattern and may extend in the second direction. A first conductive line may contact respective lower surfaces of the lower electrodes of the stacked structures and extend in a first direction perpendicular to the second direction. A second conductive line may contact an upper surface of the upper electrode and extend in the second direction. At least one of the middle electrode and the upper electrode may include a conductive material including carbon.

According to example embodiments, there is provided a variable resistance memory device. The variable resistance memory device may include a plurality of structures. Each of the structures may be formed on a substrate, and may include a first electrode, a variable resistance pattern on the first electrode, a selection pattern on the variable resistance pattern and a threshold voltage control pattern contacting at least one of an upper surface and a lower surface of the selection pattern and configured to either increase or decrease a threshold voltage of the selection pattern. A second electrode may be formed on the structures and may extend in a second direction parallel to an upper surface of the substrate. A first conductive line may contact respective lower surfaces of the first electrodes of the structures and extend in a first direction perpendicular to the second direction. A second conductive line may contact an upper surface of the second electrode and extend in the second direction.

According to example embodiments, there is provided a variable resistance memory device. The variable resistance memory device may include a plurality of structures. Each of the structures may be formed on a substrate, and may include a lower electrode, a selection pattern on the lower electrode, a threshold voltage control pattern contacting at least one of an upper surface and a lower surface of the selection pattern and configured to either increase or decrease a threshold voltage of the selection pattern and a variable resistance pattern on the selection pattern. An upper electrode may be formed on the structures and may extend in a second direction parallel to an upper surface of the substrate. A first conductive line may contact respective lower electrodes of the structures and extend in a first direction perpendicular to the second direction. A second conductive line may be formed on the upper electrode and may extend in the second direction. The lower electrode may include a conductive material including carbon.

According to example embodiments, the variable resistance memory device may have a threshold voltage control pattern, so that the selection pattern may have a target threshold voltage. Also, the electrode including the conductive material including carbon may be formed to contact the selection pattern, so that a characteristic of the selection pattern may be maintained. Therefore, the variable resistance memory device may have good characteristics.

BRIEF DESCRIPTION OF THE DRAWINGS

Example embodiments will be more clearly understood from the following detailed description taken in conjunction with the accompanying drawings. FIGS. 1 to 21 represent non-limiting, example embodiments as described herein.

FIG. 1 is a cross-sectional view illustrating a variable resistance memory device in accordance with example embodiments;

FIG. 3 is a cross-sectional view of a variable resistance memory device in accordance with example embodiments;

FIG. 4 is a cross-sectional view of a variable resistance memory device in accordance with example embodiments;

FIG. 5 is a cross-sectional view of a variable resistance memory device in accordance with example embodiments;

FIGS. 6 to 10 are cross-sectional views illustrating stages of a method of manufacturing a variable resistance memory device in accordance with example embodiments;

FIG. 11 is a perspective view illustrating a variable resistance memory device in accordance with example embodiments;

FIGS. 12 to 18 are perspective views illustrating stages of a method of manufacturing a variable resistance memory device in accordance with example embodiments;

FIG. 19 is a perspective view illustrating a variable resistance memory device in accordance with example embodiments; and FIGS. 20 and 21 are cross-sectional views illustrating stages of a method of manufacturing a variable resistance memory device in accordance with example embodiments.

DETAILED DESCRIPTION

Figure 1:
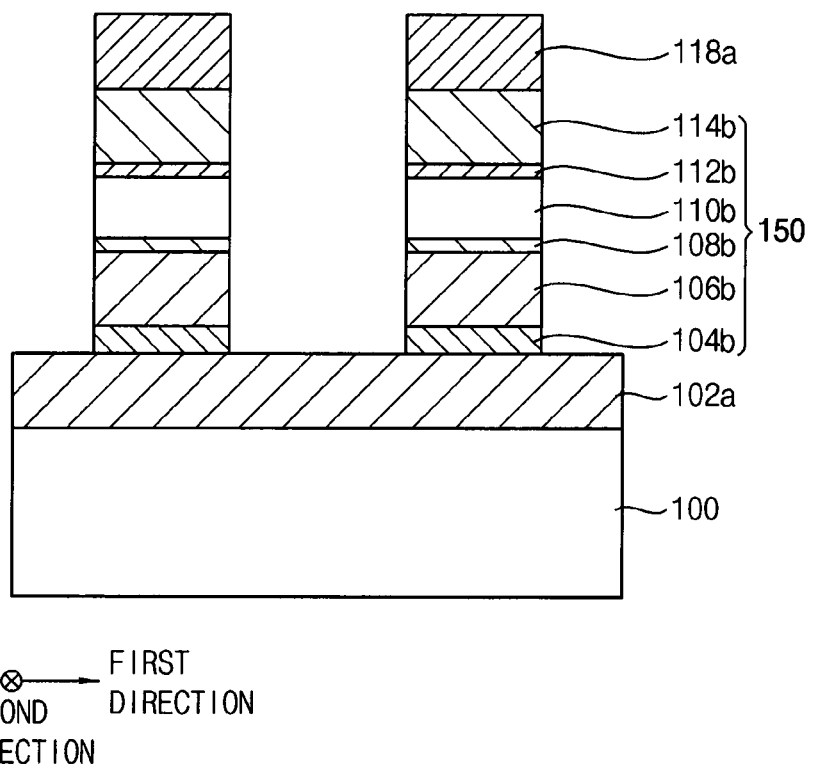
Figure 2A:
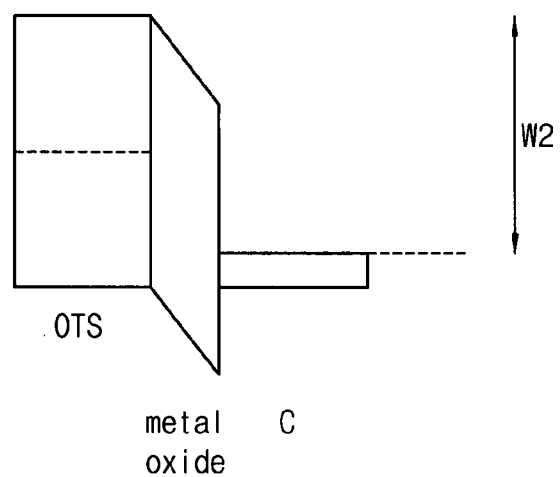
FIGS. 2A and 2B are energy bands of a bonding structure of a selection pattern, a threshold voltage control pattern, and an upper electrode, respectively, according to example embodiments.
Figure 2B:
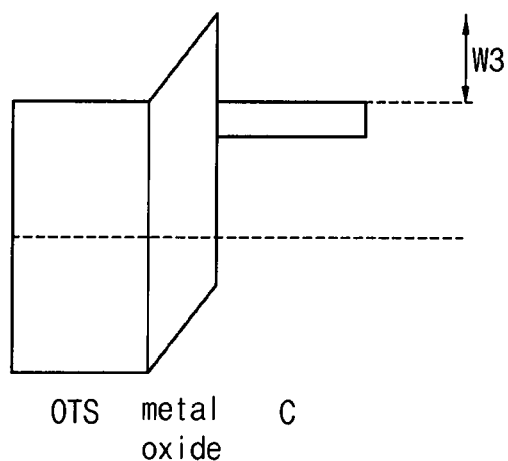
Figure 2C:
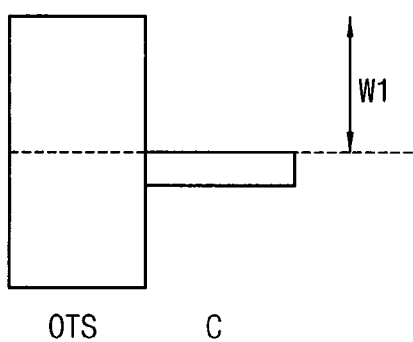
FIG. 2C is an energy band of a bonding structure of a selection pattern and an upper electrode.

FIG. 1 is a cross-sectional view illustrating a variable resistance memory device in accordance with example embodiments. FIGS. 2A and 2B are energy bands of a bonding structure of a selection pattern, a threshold voltage control pattern, and an upper electrode, respectively, according to example embodiments. FIG. 2C is an energy band of a bonding structure of a selection pattern and an upper electrode.

Referring to FIG. 1, a variable resistance memory device may include a first conductive line 102a, a second conductive line 118a, and a variable resistance memory cell 150. The variable resistance memory cell 150 may be formed at a cross point of the first conductive line 102a and the second conductive line 118a, and thus the variable resistance memory device may have a cross-point array structure. For example, the variable resistance memory device may include a memory cell array having a plurality of variable resistance memory cells 150 connected to a plurality of word lines and a plurality of bit lines.

The first conductive line 102a may extend lengthwise in a first direction parallel to an upper surface of the substrate 100. A pattern, layer or line described as extending "lengthwise" in a particular direction has a length in the particular direction and a width perpendicular to that direction, where the length is greater than the width. The second conductive line 118a may extend lengthwise in a second direction parallel to the upper surface of the substrate 100 and perpendicular to the first direction. The first and second conductive lines 102a and 118a may be spaced apart from each other in a third direction perpendicular to the upper surface of the substrate 100.

In example embodiments, the first and second conductive lines 102a and 118a may be a word line and a bit line of the memory cell array. In other example embodiments, the first and second conductive lines 102a and 118a may be a bit line and a word line of the memory cell array. For example, each of the variable resistance memory cells 150 may be positioned at a respective cross point between the word lines and the bit lines.

The variable resistance memory cell 150 may contact an upper surface of the first conductive line 102a and a lower surface of the second conductive line 118a, respectively. It will be understood that when an element is referred to as being "directly connected" or "directly coupled" to another element or on another element, there are no intervening elements present. The term "contact" of "contacting" refers to a direct connection (i.e., touching), unless the context indicates otherwise.

The substrate 100 may include a semiconductor substrate, e.g., a silicon substrate, a germanium substrate, a silicon-germanium substrate, a silicon-on-insulator (SOI) substrate, or a germanium-on-insulator (GOI) substrate, etc. The substrate 100 may include III-V compounds, e.g., GaP, GaAs, GaSb, etc. An upper portion of the substrate 100 may include well regions doped with p-type or n-type impurities.

In example embodiments, an insulation layer (not shown) may be further formed on the substrate 100. Thus, the first conductive line 102a may be formed on the insulation layer.

In some example embodiments, a peripheral circuit (not shown) including a transistor, a contact, a wiring, etc. may be formed on the substrate 100. Also, a lower insulation layer (not shown) at least partially covering the peripheral circuit may be formed on the substrate 100.

The first conductive line 102a may include a metal or metal nitride such as copper, aluminum, tungsten, cobalt, titanium, tantalum, titanium nitride (TiNx), tungsten nitride (WNx), tantalum nitride(TaNx), etc.

In example embodiments, the variable resistance memory cell 150 may include a lower electrode 104b, a variable resistance pattern 106b, a middle electrode 108b, a selection pattern 110b, a threshold voltage control pattern 112b and an upper electrode 114b sequentially stacked. The variable resistance memory cell 150 may have a pillar shape.

The lower electrode 104b may include a metal nitride or a metal silicon nitride having a resistance higher than a resistance of the first conductive line 102a. For example, lower electrode 104b may include titanium nitride, titanium silicon nitride, tungsten nitride, tungsten silicon nitride, tantalum nitride, tantalum silicon nitride, zirconium nitride, or zirconium silicon nitride, etc.

The variable resistance pattern 106b may include a phase change material that can be a phase transition between an amorphous state and a crystalline state due to joule heat transferred from the lower electrode 104b. A resistance of the variable resistance pattern 106b may be changed by the phase transition of the variable resistance pattern 106b, and thus the variable resistance memory cell 150 may be a set state or a reset state. In this case, the variable resistance memory cell 150 may serve as a memory cell of a phase-change random access memory (PRAM) device.

In example embodiments, the phase change material may include GST materials in which germanium (Ge), antimony (Sb), and/or tellurium (Te) may be combined at a predetermined ratio. In some example embodiments, the variable resistance pattern 106b may have a super lattice structure including GeTe layer and SbTe layer alternatively stacked. The variable resistance pattern 106b may include In—Sb—Te (IST) materials or Bi—Sb—Te (BST) materials.

In some example embodiments, the variable resistance pattern 106b may include a material whose resistance may be changed by a magnetic field or a spin transfer torque (STT). For example, the variable resistance pattern 106b may include a ferromagnetic material, e.g., iron (Fe), nickel (Ni), cobalt (Co), dysprosium (Dy), gadolinium (Gd) or the like. In this case, the variable resistance memory cell may be used in a magnetic random access memory (MRAM) device.

In some example embodiments, the variable resistance pattern 106b may include a perovskite-based material or a transition metal oxide. The perovskite-based material may include, e.g., STO (SrTiO$_3$), BTO (BaTiO$_3$), PCMO (Pr$_{1-x}$Ca$_x$MnO$_3$) or the like. The transition metal oxide may include, e.g., zirconium oxide (ZrOx), hafnium oxide (HfOx), aluminum oxide (AlOx), etc. In this case, the variable resistance memory cell may be used in a resistive random access memory (ReRAM) device.

In example embodiments, the middle electrode 108b may include a conductive material including carbon. The middle electrode 108b may include amorphous carbon. For example, the middle electrode 108b may include one of C, CN, TiCN, and TaCN.

In example embodiments, the middle electrode 108b may contact the selection pattern 110b. The conductive material including the carbon may hardly react with ovonic threshold switch (OTS) material subsequently formed. Also, the conductive material including the carbon may prevent diffusion of the OTS material. Thus, the middle electrode 108b may serve as a diffusion barrier layer of the selection pattern 110b.

In some example embodiments, the middle electrode 108b may include a metal nitride or a metal silicon nitride. In some example embodiments, the middle electrode 108b may not be formed.

In example embodiments, the selection pattern 110b may include a chalcogenide-based ovonic threshold switch (OTS) material. In one embodiment, the selection pattern 110b may include arsenic (As), and may further include at least two of silicon (Si), germanium (Ge), antimony (Sb), tellurium(Te), selenium(Se), indium (In) and tin (Sn). In one embodiment, the selection pattern 110b may include Se, and may further include at least two of As, Si, Ge, Sb, Te, In, and Sn.

In example embodiments, the selection pattern 110b may include a compound of 5 components system such as AsTeGeSiIn, or a compound of 6 components system such as AsTeGeSiSbS. In example embodiments, the selection pattern 110b may further include dopants, e.g., carbon (C), boron (B), oxygen (O), nitrogen (N), sulfur (S) and/or phosphorus (P).

The OTS material used as the selection pattern 110b may have an intrinsic threshold voltage. That is, a threshold voltage of the OTS material may be hardly changed by doping or surface treatment, etc. However, the threshold voltage of the OTS material may be changed by a deposition thickness of the OTS material. For example, as a thickness of the OTS material increases, a threshold voltage of the selection pattern 110b may be increased. Accordingly, the threshold voltage of the selection pattern 110b may be changed by a deposition process and a patterning process for forming the selection pattern 110b. Also, a variation of the threshold voltage of the selection pattern 110b may be generated due to the deposition process and the patterning process.

In example embodiments, the upper electrode 114b may include a conductive material including carbon. The upper electrode 114b may include amorphous carbon. For example, the upper electrode 114b may include one of C, CN, TiCN, and TaCN.

As the upper electrode 114b includes a conductive material including the carbon, the upper electrode 114b may have effective heat dissipation characteristics. Since the conductive material including the carbon hardly reacts with the OTS material, the characteristic of the OTS material may be maintained. Also, the conductive material including the carbon may prevent diffusion of the OTS material. Thus, the upper electrode 114b may serve as a diffusion barrier layer of the selection pattern 110b.

When the upper electrode 114b is formed of a metal, the metal may be easily reacted with the OTS material, and thus the characteristic of the OTS material may be changed. Also, the OTS material may be diffused to the metal.

As described above, the middle electrode 108b and the upper electrode 114b including the carbon may be formed on a lower portion and/or an upper portion of the OTS material, so that the characteristic of the OTS material may be maintained. Thus, the variable resistance memory device may have high reliability.

In example embodiments, an electrode including carbon may be formed on at least one of the upper and lower portions of the selection pattern 110b including the OTS material. Also, the threshold voltage control pattern 112b may contact at least one surface of the selection pattern 110b. In example embodiments, the threshold voltage control pattern 112b may be formed between the selection pattern 110b and one of the electrodes including the carbon (i.e., one of the middle electrode 108b and the upper electrode 114b).

In example embodiments, the threshold voltage control pattern 112b may be formed between the selection pattern 110b and the upper electrode 114b.

In example embodiments, the threshold voltage control pattern 112b may include a metal oxide, such as a transition metal oxide, an oxide of a rare earth element. In example embodiments, a thickness of the threshold voltage control pattern 112b may be less than a thickness of the selection pattern 110b.

A schottky barrier between the selection pattern 110b and the upper electrode 114b may be increased or decreased by a material of the threshold voltage control pattern 112b. Thus, an effective work function between the selection pattern 110b and the upper electrode 114b may be also increased or decreased by the material of the threshold voltage control pattern 112b.

Referring to FIG. 2C, the selection pattern including the OTS material and the upper electrode including the carbon may directly contact to each other, without the threshold voltage control pattern. In this case, a work function between the selection pattern and the upper electrode 114b may be referred to as a first work function W1.

Referring to FIG. 2A, a threshold voltage control pattern may be formed between a selection pattern and an upper electrode, and thus a schottky barrier between the selection pattern including the OTS material and the upper electrode including carbon may be increased by the threshold voltage control pattern. Therefore, an effective work function between the selection pattern and the upper electrode may be a second work function W2 higher than the first work function W1. Also, a threshold voltage for switching of the selection pattern may be increased.

Referring to FIG. 2B, a threshold voltage control pattern may be formed between a selection pattern and an upper electrode, and thus a schottky barrier between the selection pattern including the OTS material and the upper electrode including carbon may be decreased by the threshold voltage control pattern. Therefore, an effective work function between the selection pattern and the upper electrode may be a third work function W3 lower than the first work function W1. Therefore, a threshold voltage for switching of the selection pattern may be decreased.

The metal oxide whose threshold voltage may be increased by the threshold voltage control pattern 112b may include, e.g., aluminum oxide, niobium oxide, titanium oxide, tantalum oxide, cadmium oxide, chromium oxide, or the like. The metal included in the metal oxide that the threshold voltage increases may be a P-type metal.

The metal oxide whose threshold voltage may be lowered by the threshold voltage control pattern 112b may include, e.g., lanthanum oxide, yttrium oxide, cerium oxide, scandium oxide, strontium oxide, erbium oxide, or the like. The metal included in the metal oxide that the threshold voltage may be lowered may be an N-type metal.

Thus, the threshold voltage of the selection pattern 110b may be controlled by the metal oxide used as the threshold voltage control pattern 112b.

The second conductive line 118a may be stacked on the upper electrode 114b. The second conductive line 118a may include a metal or a metal nitride, e.g., copper, aluminum, tungsten, cobalt, titanium, tantalum, titanium nitride (TiNx), tungsten nitride (WNx), tantalum nitride (TaNx), etc.

Hereinafter, embodiments of the variable resistance memory device including variable resistance memory cells having a modified stacked structure may be described.

Figure 3:
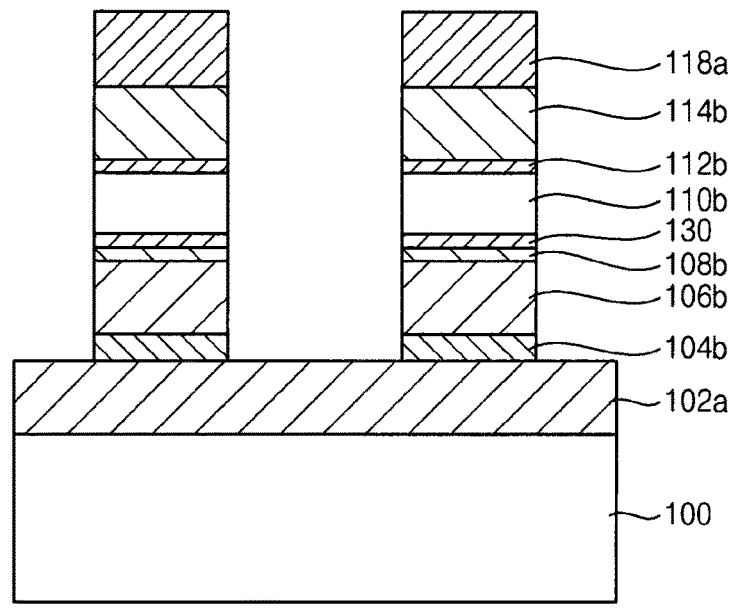

FIG. 3 is a cross-sectional view of a variable resistance memory device in accordance with example embodiments.

Referring to FIG. 3, a variable resistance memory device may include a first conductive line 102a, a second conductive line 118a, and a variable resistance memory cell 160. The variable resistance memory cell 160 may include a lower electrode 104b, a variable resistance pattern 106b, a middle electrode 108b, a first threshold voltage control pattern 130, a selection pattern 110b, a second threshold voltage control pattern 112b, and an upper electrode 114b sequentially stacked.

In example embodiments, the middle electrode 108b and the upper electrode 114b may include a conductive material including carbon. In example embodiments, the selection pattern 110b may include an OTS material.

In example embodiments, the first threshold voltage control pattern 130 may be formed between the middle electrode 108b and the selection pattern 110b. The second threshold voltage control pattern 112b may be formed between the selection patterns 110b and the upper electrodes 114b.

In example embodiments, each of the first and second threshold voltage control patterns 130 and 112b may be formed by the same material.

Figure 4:
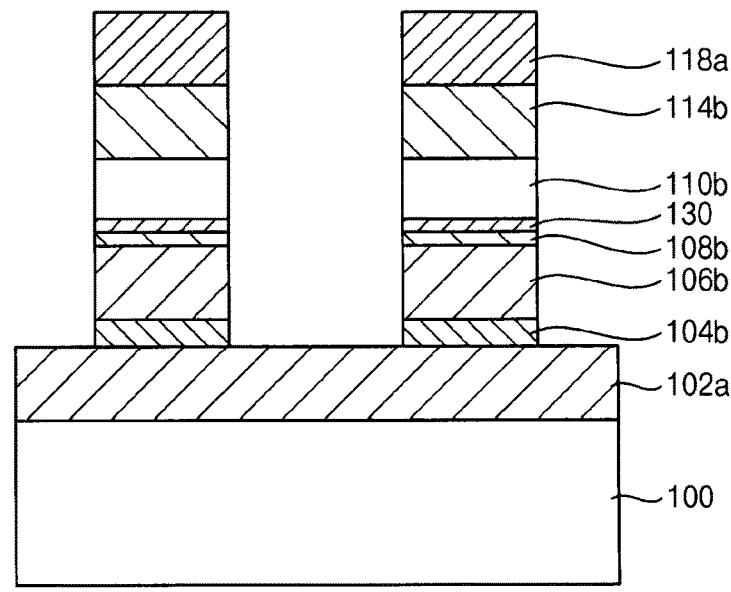

FIG. 4 is a cross-sectional view of a variable resistance memory device in accordance with example embodiments.

Referring to FIG. 4, a variable resistance memory device may include a first conductive line 102a, a second conductive line 118a, and a variable resistance memory cell 170. The variable resistance memory cell 170 may include a lower electrode 104b, a variable resistance pattern 106b, a middle electrode 108b, a first threshold voltage control pattern 130, a selection pattern 110b, and an upper electrode 114b sequentially stacked.

In example embodiments, the middle electrode 108b may include a conductive material including carbon. In example embodiments, the selection pattern 110b may include an OTS material.

In example embodiments, the first threshold voltage control pattern 130 may be formed between the middle electrode 108b and the selection pattern 110b.

In example embodiments, the upper electrode 114b may include a conductive material including carbon. In some example embodiments, the upper electrode 114b may include a metal nitride or a metal silicon nitride.

Figure 5:
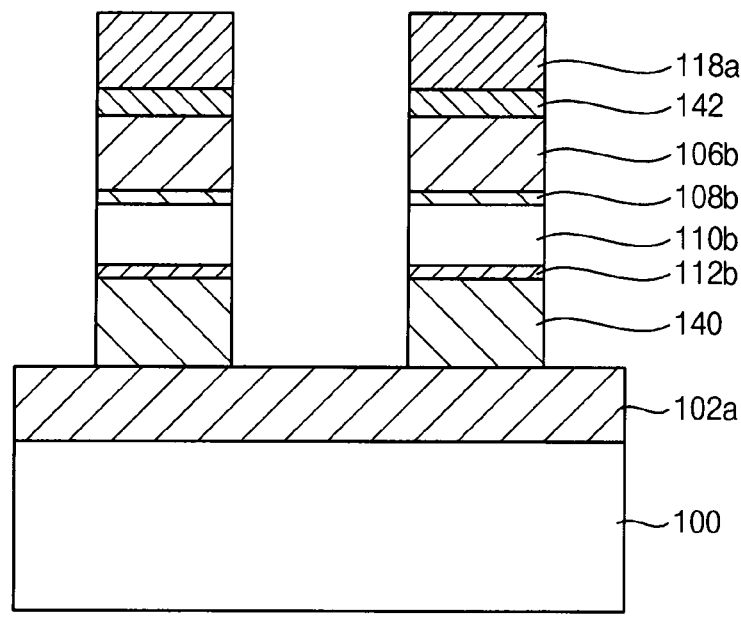

FIG. 5 is a cross-sectional view of a variable resistance memory device in accordance with example embodiments.

Referring to FIG. 5, a variable resistance memory device may include a first conductive line 102a, a second conductive line 118a, and a variable resistance memory cell 180 between the first and second conductive lines 102a and 118a. The variable resistance memory cell 180 may have a reversed structure of the variable resistance memory cell 150 shown in FIG. 1.

The variable resistance memory cell 180 may include a lower electrode 140, a threshold voltage control pattern 112b, a selection pattern 110b, a middle electrode 108b, a variable resistance pattern 106b, and an upper electrode 142 sequentially stacked.

In some example embodiments, the variable resistance memory device may include a variable resistance memory cell (not shown) having a reversed structure of the variable resistance memory cell shown in FIG. 3.

In some example embodiments, the variable resistance memory device may include a variable resistance memory cell (not shown) having a reversed structure of the variable resistance memory cell shown in FIG. 4.

FIGS. 6 to 10 are cross-sectional views illustrating stages of a method of manufacturing a variable resistance memory device in accordance with example embodiments.

Figure 6:
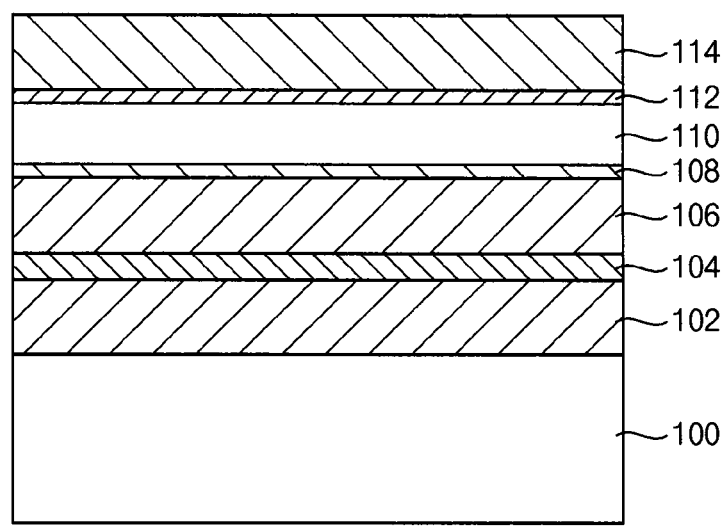
Figure 7:
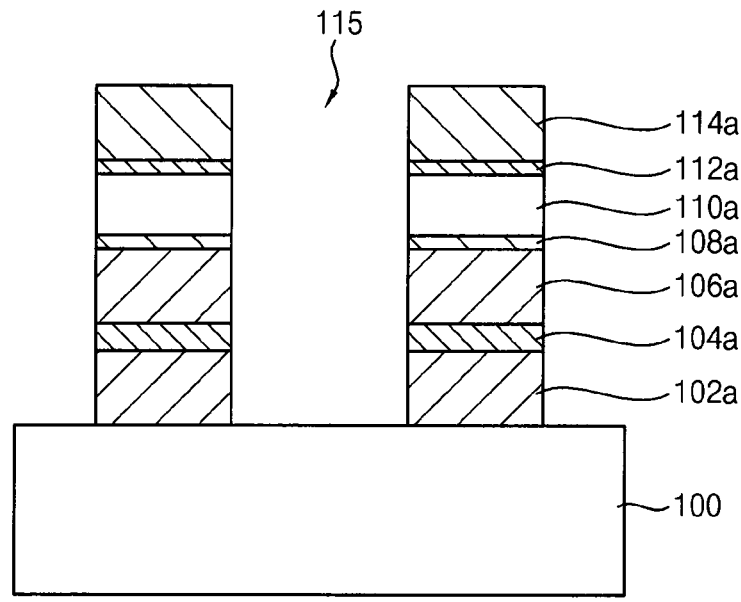
Figure 8:
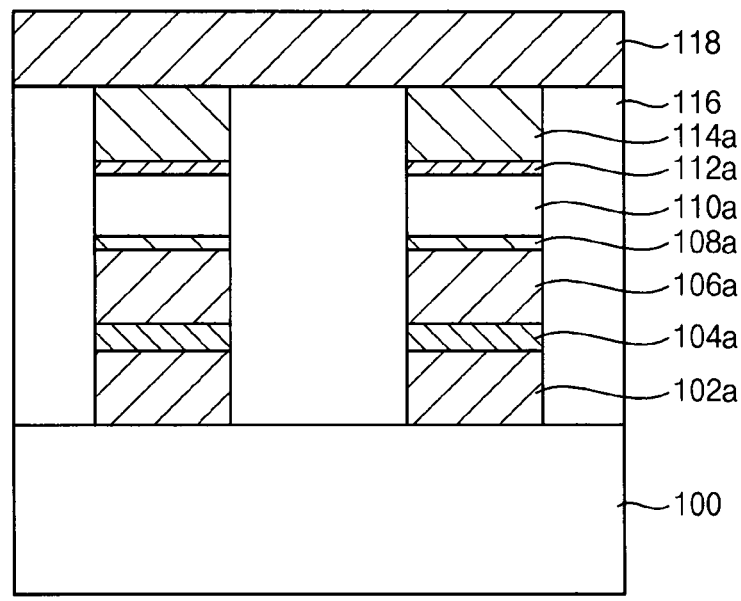
Figure 9:
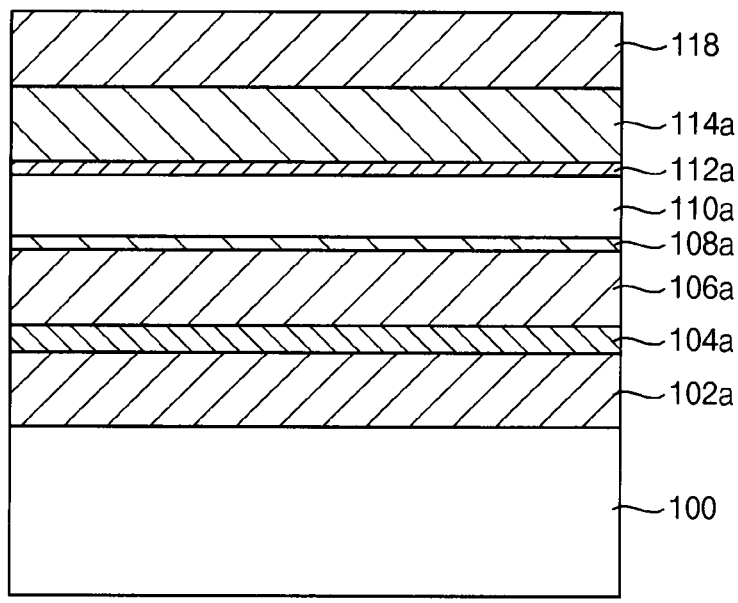
Figure 10:
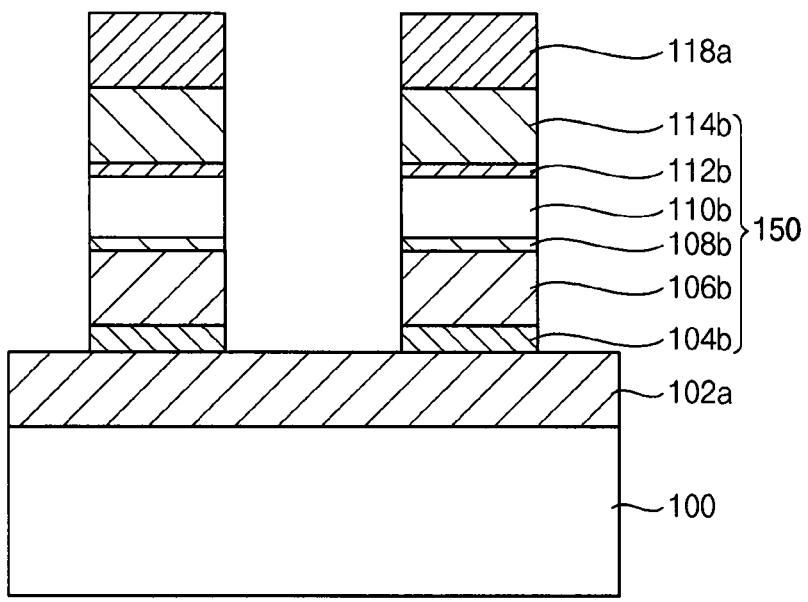

FIGS. 6 to 8 are cross-sectional views of the variable resistance memory device taken along the second direction, and FIGS. 9 and 10 are cross-sectional views of the variable resistance memory device taken along the first direction FIG. 6, a first conductive layer 102, a lower electrode layer 104, a variable resistance layer 106, a middle electrode layer 108, a selection layer 110, a threshold voltage control layer 112 and the upper electrode layer 114 sequentially stacked on a substrate 100.

In some example embodiments, a peripheral circuit (not shown) including transistors, contacts, wiring, or the like may be formed on the substrate 100. A lower insulation layer (not shown) at least partially covering the peripheral circuit may be formed on the substrate 100.

In example embodiments, the first conductive layer 102 may be formed to include a metal, e.g., W, Cu, Al, Ti, Ta, etc. In example embodiments, the lower electrode layer 104 may be formed to include a metal nitride or a metal silicon nitride.

In example embodiments, the variable resistance layer 106 may be formed to include a phase change material, e.g., GST material, IST material, BST material. In some example embodiments, the variable resistance layer 106 may be formed to include a ferromagnetic material. In some example embodiments, the variable resistance layer 106 may be formed to include a perovskite-based material or a transition metal oxide.

In example embodiments, the middle electrode layer 108 may include a conductive material including carbon. In some example embodiments, the middle electrode layer 108 may include a metal nitride or a metal silicon nitride. In some example embodiments, the middle electrode layer may not be formed.

In example embodiments, the selection layer 110 may include an OTS material

In example embodiments, the threshold voltage control layer 112 may include a metal oxide, such as a transition metal oxide, an oxide of a rare earth element.

The threshold voltage control layer 112 may include, e.g., aluminum oxide, niobium oxide, titanium oxide, tantalum oxide, cadmium oxide, chromium oxide, etc. In this case, a threshold voltage of a selection pattern may be increased by the threshold voltage control layer 112.

The threshold voltage control layer 112 may include, e.g., lanthanum oxide, yttrium oxide, cerium oxide, scandium oxide, strontium oxide, erbium oxide, etc. In this case, the threshold voltage of the selection pattern may be lowered by the threshold voltage control layer 112.

The upper electrode layer 114 may include a conductive material including carbon.

The first conductive layer 102, the lower electrode layer 104, the variable resistance layer 106, the middle electrode layer 108, the selection layer 110, the threshold voltage control layer 112 and the upper electrode layer may be formed by, e.g., a physical vapor deposition (PVD) process, a sputtering process, an atomic layer deposition (ALD) process, or a chemical vapor deposition (CVD) process.

Referring to FIG. 7, the upper electrode layer 114, the threshold voltage control layer 112, the selection layer 110, the middle electrode layer 108, the variable resistance layer 106, the lower electrode layer 104, and the first conductive layer 102 may be partially and sequentially etched to form a plurality of line structures extending lengthwise in the first direction. Also, a first trench 115 may be formed between the line structures.

The line structure may include a first conductive line 102a, a preliminary lower electrode 104a, a preliminary variable resistance pattern 106a, a preliminary middle electrode 108a, a preliminary selection pattern 110a, a preliminary threshold voltage control pattern 112a, and a preliminary upper electrode 114a sequentially stacked on the substrate 100.

Referring to FIGS. 8 and 9, an insulation pattern 116 may be formed to fill the first trench 115. A second conductive layer 118 may be formed on the preliminary upper electrode 114a and the insulation pattern 116.

Referring to FIG. 10, the second conductive layer 118 may be etched along the second direction to form second conductive lines 118a extending lengthwise in the second direction.

Then, the preliminary upper electrode 114a exposed by a portion between the second conductive lines 118a, the preliminary threshold voltage control pattern 112a, the preliminary selection pattern 110a, the preliminary middle electrode 108a, the preliminary variable resistance pattern 106a and the preliminary lower electrode 104a and the insulation pattern 116 may be sequentially etched. Thus, an upper surface of the first conductive line 102a may be exposed.

By the etching process, a variable resistance memory cell 150 including the lower electrode 104b, the variable resistance pattern 106b, the middle electrode 108b, the selection pattern 110b, the threshold voltage control pattern 112b, and the upper electrode stacked together may be formed between the first conductive line 102a and the second conductive line 118a. The variable resistance memory cell 150 may have a pillar shape. A plurality of variable resistance memory cells 150 may be formed at each of cross points of the first conductive line 102a and the second conductive line 118a, so that the variable resistance memory cells 150 may have a cross-point cell array.

The variable resistance memory device shown in FIG. 1 may be manufactured by performing the above-described processes. However, a stacked structure of the layers formed on the substrate may be changed, and the same processes as described above may be performed to the layers. Thus, at one of the variable resistance memory devices shown in FIGS. 3 to 5 may be manufactured.

Figure 11:
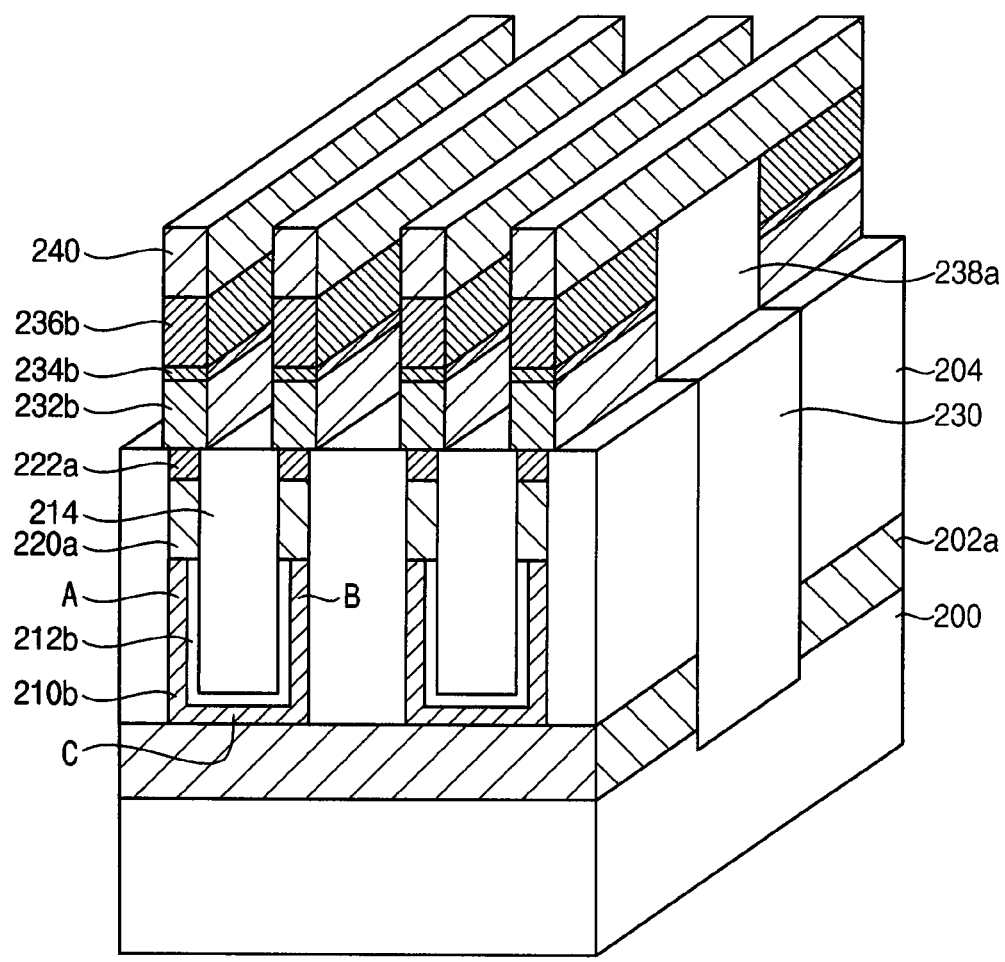

FIG. 11 is a perspective view illustrating a variable resistance memory device in accordance with example embodiments. The variable resistance memory device described below may be substantially the same as the variable resistance memory device shown in FIG. 1 except for a shape of each of elements. For example, the materials constituting the elements of the variable resistance memory device may be substantially the same as those of the variable resistance memory device shown in FIG. 1.

Referring to FIG. 11, the variable resistance memory device may have a cross point array structure in which variable resistance memory cells may be formed at the cross point of the first conductive line 202a and the second conductive line 240.

In example embodiments, the first and second conductive lines 202a and 240 may be a word line and a bit line of the memory cell array. In other example embodiments, the first and second conductive lines 202a and 240 may be a bit line and a word line of the memory cell array. For example, each of the variable resistance memory cells 150 may be positioned at a respective cross point between the word lines and the bit lines The variable resistance memory cell may include a lower electrode 210b, a variable resistance pattern 220a, a middle electrode 222a, a selection pattern 232b, a threshold voltage control pattern 234b, and an upper electrode 236b sequentially stacked on the substrate 200.

The lower electrode 210b may contact an upper surface of the first conductive line 202a to have a U-shape. The lower electrode 210b may include a first lower electrode A, a second lower electrode B and a third conductive line C. For example, the first lower electrode A of a first variable resistance memory cell and a second lower electrode B of a second variable resistance memory cell adjacent to the first variable resistance memory cell in the first direction may be connected to each other through the third conductive line C contacting each of the first and second lower electrodes A and B. The third conductive line C may extend lengthwise in the first direction. In example embodiments, an insulation liner 212b may be further formed on an inner surface of the lower electrode 210b.

The variable resistance pattern 220a may protrude in the third direction perpendicular to an upper surface of the substrate 200 from an uppermost surface of lower electrode 210b having the U-shape.

The middle electrode 222a may be formed on each variable resistance pattern 220a. The middle electrode 222a may extend lengthwise in the second direction. Thus, a first structure including the lower electrode 210b, the variable resistance pattern 220a, and the middle electrode 222a sequentially stacked may have a U-shape, in a cross-sectional view cutting along in the first direction. In some example embodiments, the middle electrode 222a may not be formed. For example, the first structure including the lower electrode 210b and the variable resistance pattern 220a sequentially stacked may have a U-shape.

In example embodiments, the middle electrode 222a may include a conductive material including carbon. The middle electrode 222a may include amorphous carbon. For example, the middle electrode 222a may include one of C, CN, TiCN, and TaCN.

A first mold pattern 204 and a second mold pattern 214 may be formed on the first conductive line 202a to fill a space between the first structures in the first direction. A third mold pattern 230 may be formed to fill a space between the first conductive lines 202a and between the first structures in the second direction. The first to third mold patterns 204, 214 and 230 may include an insulation material. In example embodiments, the first to third mold patterns 204, 214 and 230 may include the same insulation material. In this case, the first to third mold patterns 204, 214 may be merged into one structure.

The selection pattern 232b may contact an upper surface of the middle electrode 222a. The selection pattern 232b may include a chalcogenide-based ovonic threshold switch (OTS) material.

As an example, a threshold voltage control pattern 234b and an upper electrode 236b may be stacked on the selection pattern 232b. As another example, the upper electrode 236b and the selection pattern 232b may be stacked on the threshold voltage control pattern 234b. The threshold voltage control pattern 234b may include a metal oxide such as a transition metal oxide or an oxide of a rare earth element. The upper electrode 236b may include a conductive material including carbon. The upper electrode 236b may include amorphous carbon. For example, the upper electrode 236b may include one of C, CN, TiCN, and TaCN.

A second structure may include the selection pattern 232b, the threshold voltage control pattern 234b, and the upper electrode 236b sequentially stacked. The second structure may have a pillar shape. An insulation pattern 238a may be formed to fill a space between the second structures in the second direction.

The second conductive line 240 may be stacked on the upper electrode 236b and the insulation pattern 238a.

In example embodiments, each of the variable resistance memory cells may include the first and second structures. For example, the first and second conductive lines 202a and 240 may be a word line and a bit line of the memory cell array. In other example embodiments, the first and second conductive lines 202a and 240 may be a bit line and a word line of the memory cell array. For example, each of the variable resistance memory cells may be positioned at a respective cross point between the word lines and the bit lines.

As the variable resistance memory device may include a threshold voltage control pattern 234b contacting at least one surface of the selection pattern 232b, a threshold voltage of the selection pattern 232b may be controlled. Also, an electrode including carbon may be formed on at least one of upper and lower portions of the selection pattern 232b including the OTS material. For example, the threshold voltage control pattern 234b may be formed between the selection pattern 232b and the electrode including carbon. Therefore, the variable resistance memory device may have high reliability.

In example embodiments, in the variable resistance memory device, the stacked structure of the variable resistance memory cell may be modified.

Although not shown, in some example embodiments, the second structure may include a first threshold voltage control pattern, the selection pattern 232b, a second threshold voltage control pattern 234b, the upper electrode 236b sequentially stacked.

Although not shown, in some example embodiments, the second structure may include the threshold voltage control pattern 234b, the selection pattern 232b, the upper electrode 236b sequentially stacked.

FIGS. 12 to 18 are perspective views illustrating stages of a method of manufacturing a variable resistance memory device in accordance with example embodiments.

Figure 12:
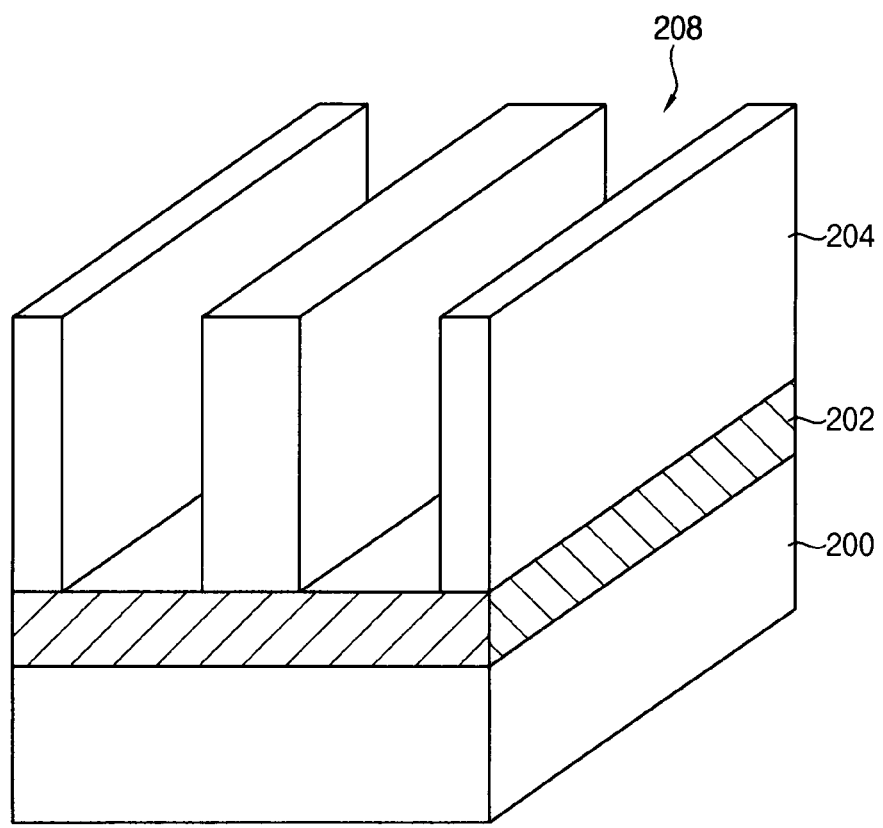

Referring to FIG. 12, a first conductive layer 202 may be formed on a substrate 200, and a first mold pattern 204 may be formed on the first conductive layer 202.

The first mold pattern 204 may be formed by forming a mold layer and etching a portion of the mold layer. A first trench 208 extending lengthwise in the second direction may be formed between first mold patterns 204. The first conductive layer 202 may be exposed by a bottom of the first trench 208. The first mold pattern 204 may include, e.g., silicon nitride.

Figure 13:
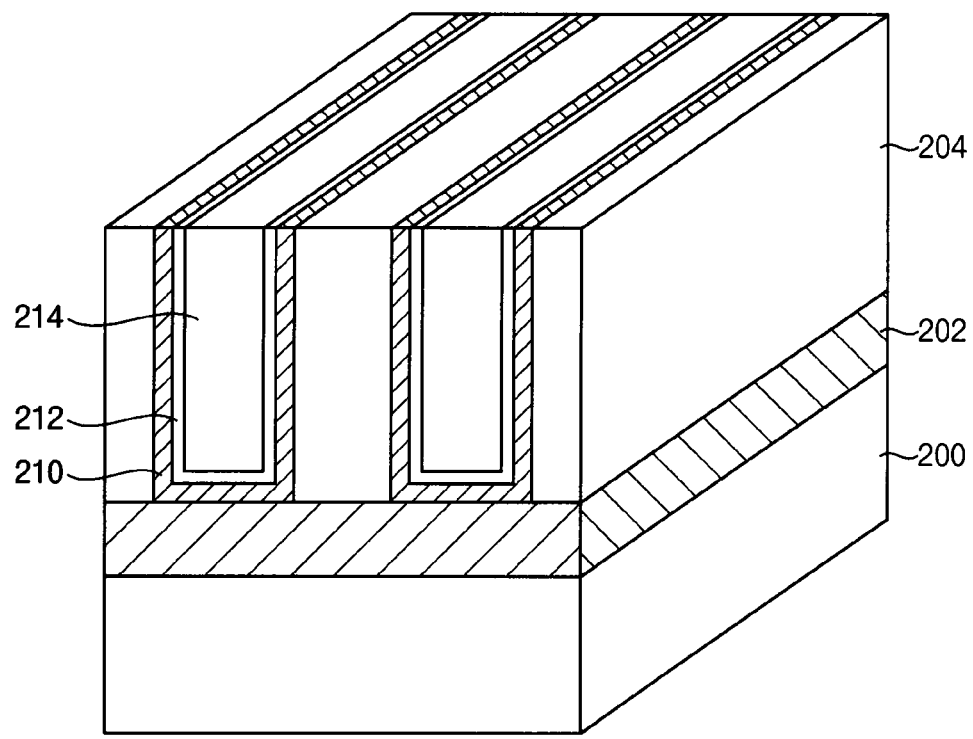

Referring to FIG. 13, a lower electrode layer and an insulation liner layer having a U-shape may be formed on a surface of the first mold pattern 204. Then, a second mold layer may be formed on the insulation liner layer to completely fill the first trench 208.

The second mold layer, the insulation liner layer, and the lower electrode layer may be planarized until an upper surface of the first mold pattern 204 may be exposed to form a first preliminary lower electrode 210, a first preliminary insulation liner 212, a second mold pattern 214 filling in the first trench 208. The first preliminary insulation liner 212 and the first preliminary insulation liner 212 may extend lengthwise in the second direction to have a U-shape. The second mold pattern 214 may be formed on the first preliminary insulation liner 212 to fill the first trench 208.

In example embodiments, the first preliminary insulation liner 212 may include silicon oxide and the second mold pattern 214 may include silicon nitride.

Figure 14:
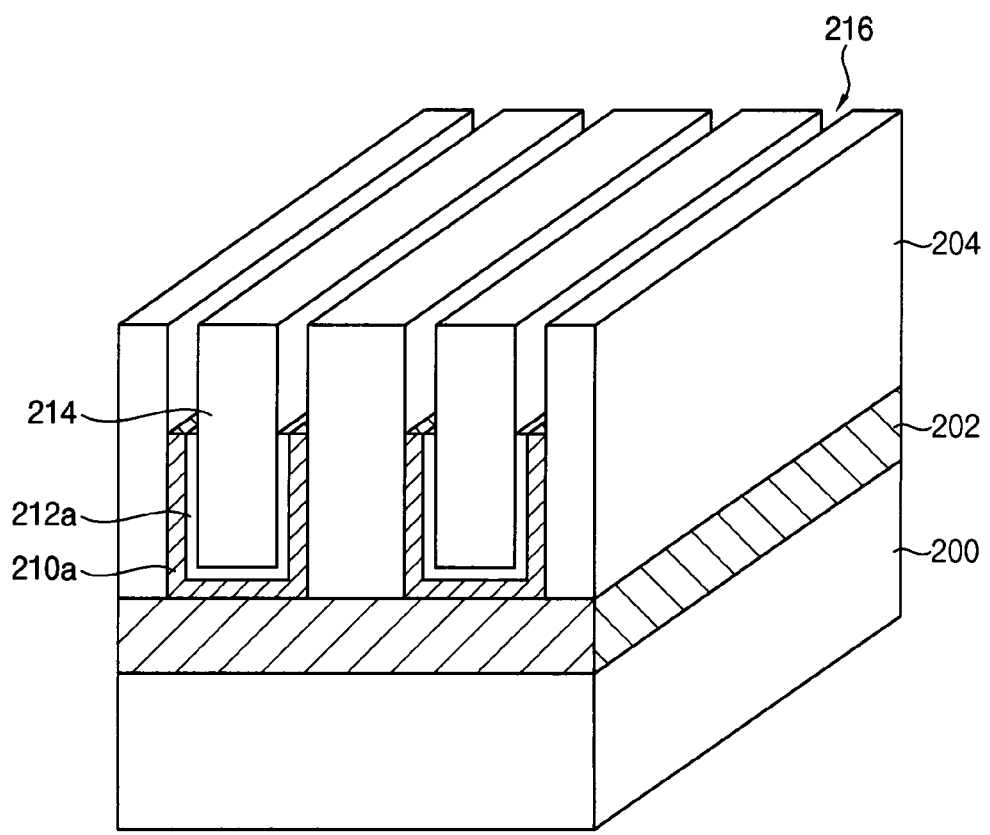

Referring to FIG. 14, upper portions of the first preliminary lower electrode 210 and the first preliminary insulation liner 212 may be etched to form the second preliminary lower electrode 210a and the second preliminary insulation liner 212a, respectively. Thus, a recess 216 extending lengthwise in the second direction may be formed above the second preliminary lower electrode 210a and the second preliminary insulation liner 212a.

Figure 15:
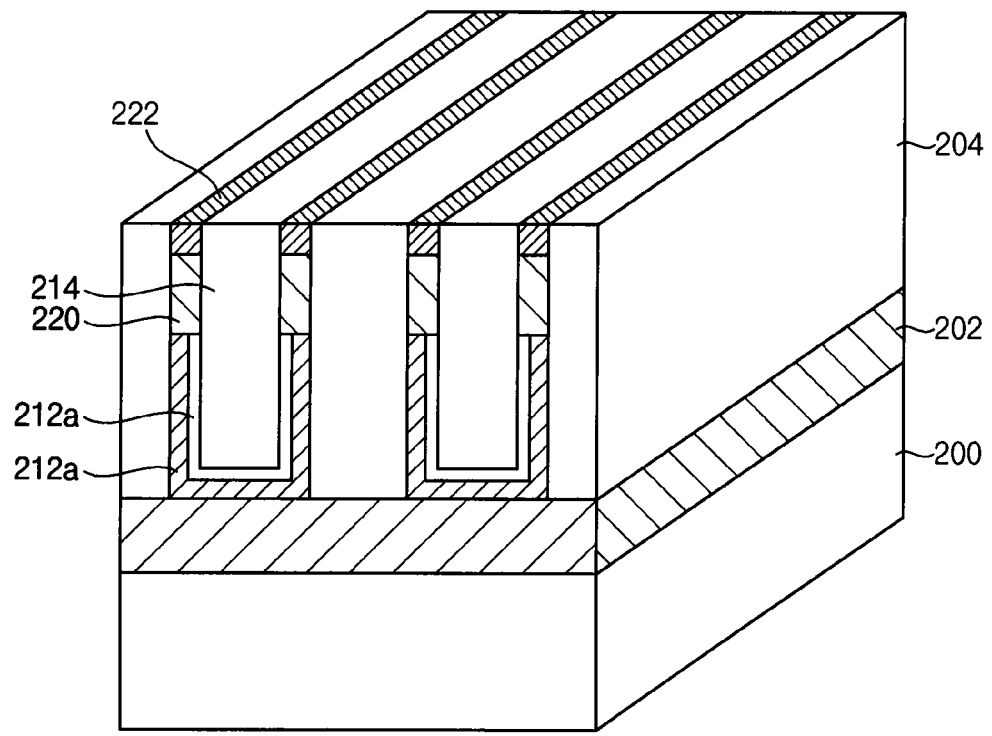

Referring to FIG. 15, a preliminary variable resistance pattern 220 and a preliminary middle electrode 222 may be sequentially stacked in the recess 216.

The preliminary variable resistance pattern 220 may be formed in a lower portion of the recess 216. The preliminary variable resistance pattern 220 may include a phase change material, such as, GST, IST, or BST materials.

The preliminary middle electrode 222 may be formed on the preliminary variable resistance pattern 220, and the preliminary middle electrode 222 may include a conductive material including carbon. The preliminary middle electrode 222 may include amorphous carbon. For example, the preliminary middle electrode 222 may include one of C, CN, TiCN, and TaCN.

Figure 16:
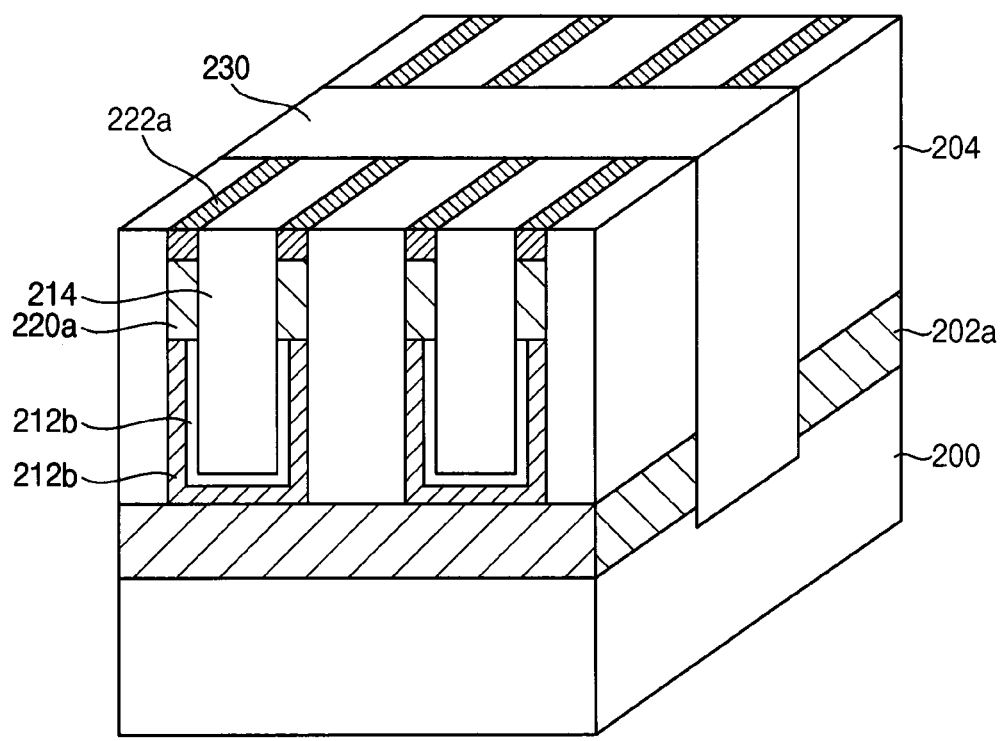
Figure 16:
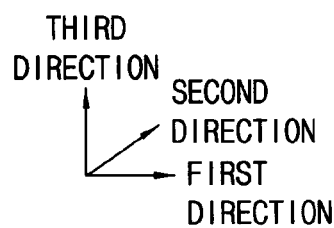

Referring to FIG. 16, the first and second mold patterns 204 and 214, the preliminary middle electrode 222, the preliminary variable resistance pattern 220, the second preliminary lower electrode 210a and the first conductive layer 202 may be partially etched to form line pattern structures extending lengthwise in the first direction. By the etching process, the preliminary middle electrode 222, the preliminary variable resistance pattern 220, the second preliminary lower electrode 210a, and the second preliminary insulation liner 212a may be cut in the first direction. Therefore, the middle electrode 222a, a variable resistance pattern 220a, a lower electrode 210b and an insulation liner 212b may be formed. Also, a first conductive line 202a may be formed to extend lengthwise in the first direction.

A second trench may be formed between the line pattern structures. Then, a third mold pattern 230 may be formed in the second trench. The third mold pattern 230 may include an insulation material.

Figure 17:
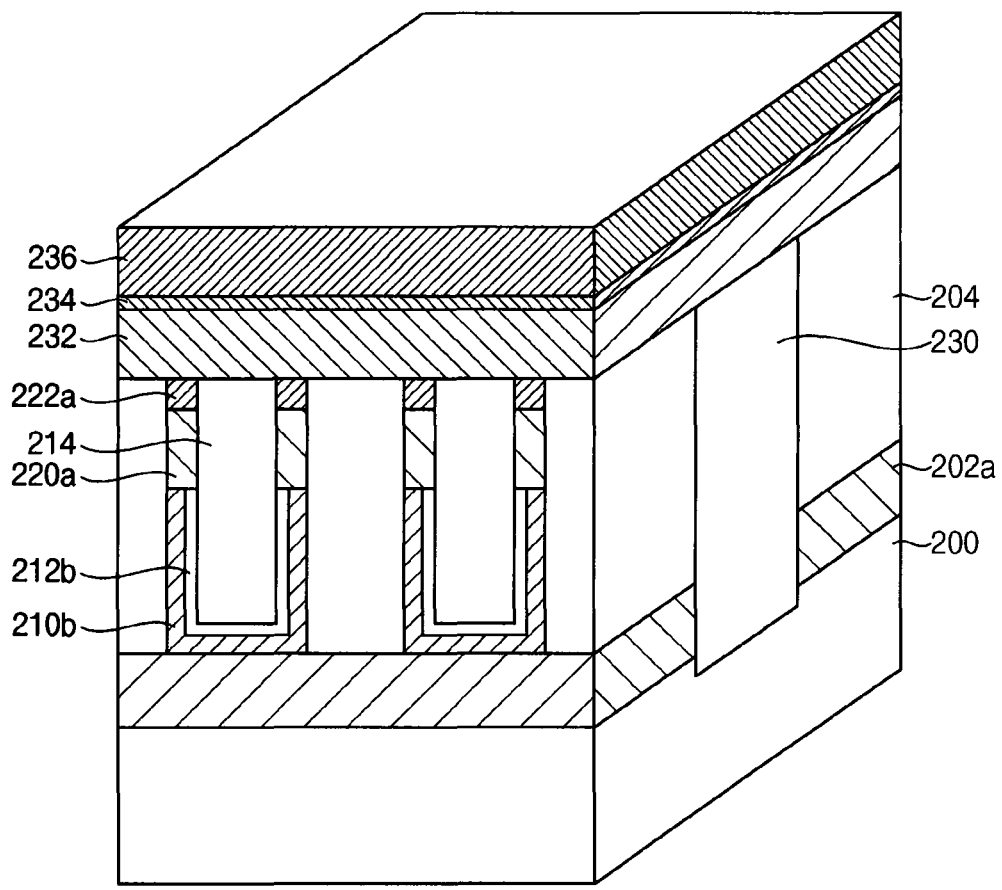

Referring to FIG. 17, a selection layer 232 may be formed on the first to third mold patterns 204, 214, and 230 and the middle electrode 222a. A threshold voltage control layer 234 and an upper electrode layer 236 are formed on the selection layer 232.

In example embodiments, the threshold voltage control layer 234 may include a metal oxide, such as a transition metal oxide, an oxide of a rare earth element. In example embodiments, the upper electrode layer 236 may include a conductive material including carbon such as C, CN, TiCN, TaCN, etc.

Figure 18:
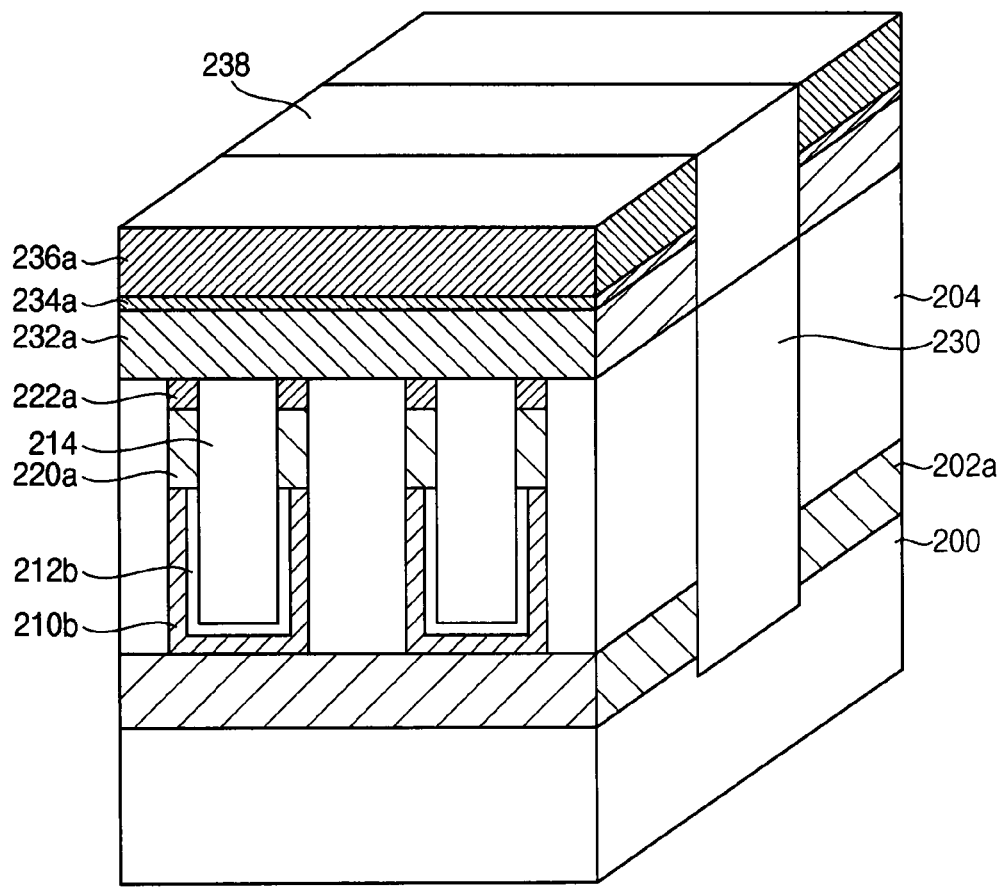
Figure 18:
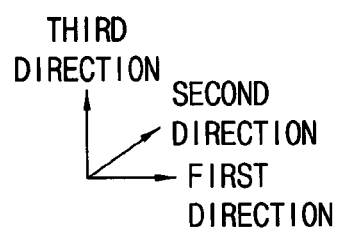

Referring to FIG. 18, the selection layer 232, the threshold voltage control layer 234 and the upper electrode layer 236 may be patterned to form a preliminary selection pattern 232a, a preliminary threshold voltage control pattern 234a and a preliminary upper electrode 236a extending lengthwise in the first direction. Further, a preliminary insulation pattern 238 may be formed in a third trench formed by the patterning process.

Referring to FIG. 11 again, a second conductive layer may be formed on the preliminary upper electrode 236a and the preliminary insulation pattern 238. The second conductive layer, the preliminary upper electrode 236a, the preliminary threshold voltage control pattern 234a, the preliminary selection pattern 232a, and the preliminary insulation pattern 238 may be patterned to form a pattern structure extending in the second direction. Thus, a second structure including a selection pattern 232b, a threshold voltage control pattern 234b, and an upper electrode 236b stacked together may be formed on the middle electrode 222a, and the second structure may have a pillar shape. An insulation pattern 238a may be formed between the second structures. Also, a second conductive line 240 extending lengthwise in the second direction may be formed on the upper electrode 236b.

An insulating interlayer (not shown) may be formed to fill the trench formed by the patterning process.

By performing the above process, a variable resistance memory device including variable resistance memory cells at the cross points of the first conductive line 102a and the second conductive line 118a may be manufactured.

In the variable resistance memory device, the stacked structure of the variable resistance memory cell structure may be variously modified. For example, in processing for manufacturing the variable resistance memory device, a stacked structure of the layers formed on the middle electrode may be changed. Therefore, in the variable resistance memory device, a threshold voltage control pattern 234b may contact at least one surface of the selection pattern 232b, and an electrode including carbon may be formed on at least one of the upper and lower portions of the selection pattern 232b.

Figure 19:
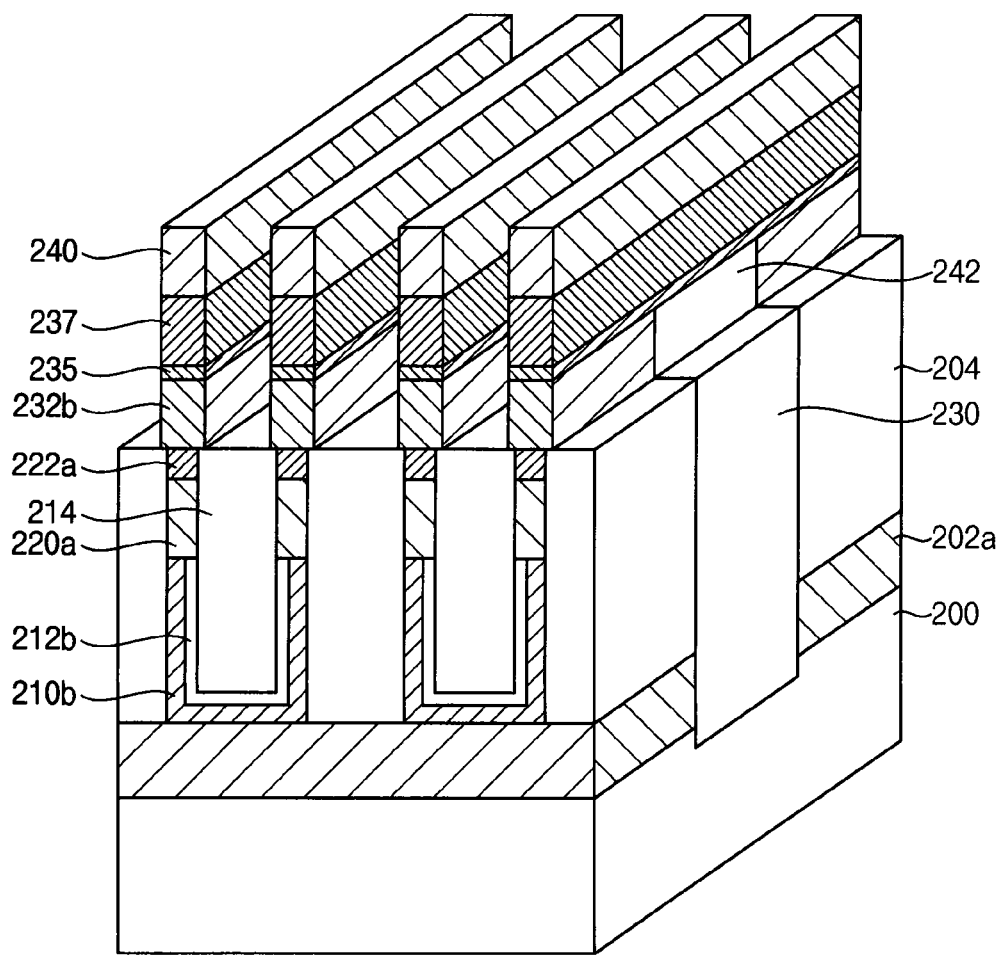
Figure 19:
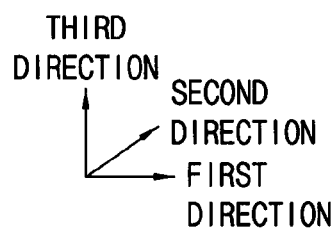

FIG. 19 is a perspective view illustrating a variable resistance memory device in accordance with example embodiments.

The variable resistance memory device may be the same as the variable resistance memory device shown in FIG. 11, except for shapes of the threshold voltage control pattern and the upper electrode.

Referring to FIG. 19, the selection pattern 232b may contact an upper surface of the middle electrode 222a. The selection pattern 232b may have a pillar shape.

An insulation pattern 242 may be formed to fill a space between the selection patterns 232b in the second direction.

A threshold voltage control pattern 235, an upper electrode 237 and a second conductive line 240 may be stacked on the selection pattern 232b and the insulation pattern 242. For example, the threshold voltage control pattern 235, the upper electrode 237, and the second conductive line 240 may extend lengthwise in the second direction. The threshold voltage control pattern 235, the upper electrode 237 and the second conductive line 240 may be commonly used for a predetermined unit of the plurality of variable resistance memory cells.

In example embodiments, a first set of variable resistance memory cells may include a first set of lower electrodes 210b, a first set of variable resistance patterns 220a, a first set of middle electrodes 222a, a first set of selection patterns 232b, the threshold voltage control pattern 235, the upper electrode 237 and the second conductive line 240. In this case, each of the threshold voltage control pattern 235, the upper electrode 237 and the second conductive line 240 may extend lengthwise in the second direction. For example, each of the threshold voltage control pattern 235, the upper electrode 237 and the second conductive line 240 may continuously extend to cover the first set of the variable resistance memory cells.

In example embodiments, although not shown, a second set of variable resistance memory cells may include a second set of lower electrodes 210b, a second set of variable resistance patterns 220a, a second set of selection patterns 232b, the threshold voltage control pattern 235, the upper electrode 237 and the second conductive line 240. In this case, the middle electrode 222a may not be formed. Each of the threshold voltage control pattern 235, the upper electrode 237 and the second conductive line 240 may extend lengthwise in the second direction. For example, each of the threshold voltage control pattern 235, the upper electrode 237 and the second conductive line 240 may continuously extend to cover the second set of the variable resistance memory cells.

In example embodiments, although not shown, a third set of the variable resistance memory cells may include a third set of lower electrodes 210b, a third set of variable resistance patterns 220a, a third set of middle electrodes 222a, a third set of selection patterns 232b, and a third set of threshold voltage control patterns 235, the upper electrode 237 and the second conductive line 240. In this case, the insulation pattern 242 may be formed to fill a space between two adjacent selection patterns 232b in the second direction and a space between two adjacent threshold voltage control patterns 235 in the second direction. Each of the threshold voltage control patterns 235 may contact at least one of an upper surface and a lower surface of each selection pattern 232b. In this case, each of the upper electrode 237 and the second conductive line 240 may extend lengthwise in the second direction. For example, each of the upper electrode 237 and the second conductive line 240 may continuously extend to cover the third set of the variable resistance memory cells.

Figure 20:
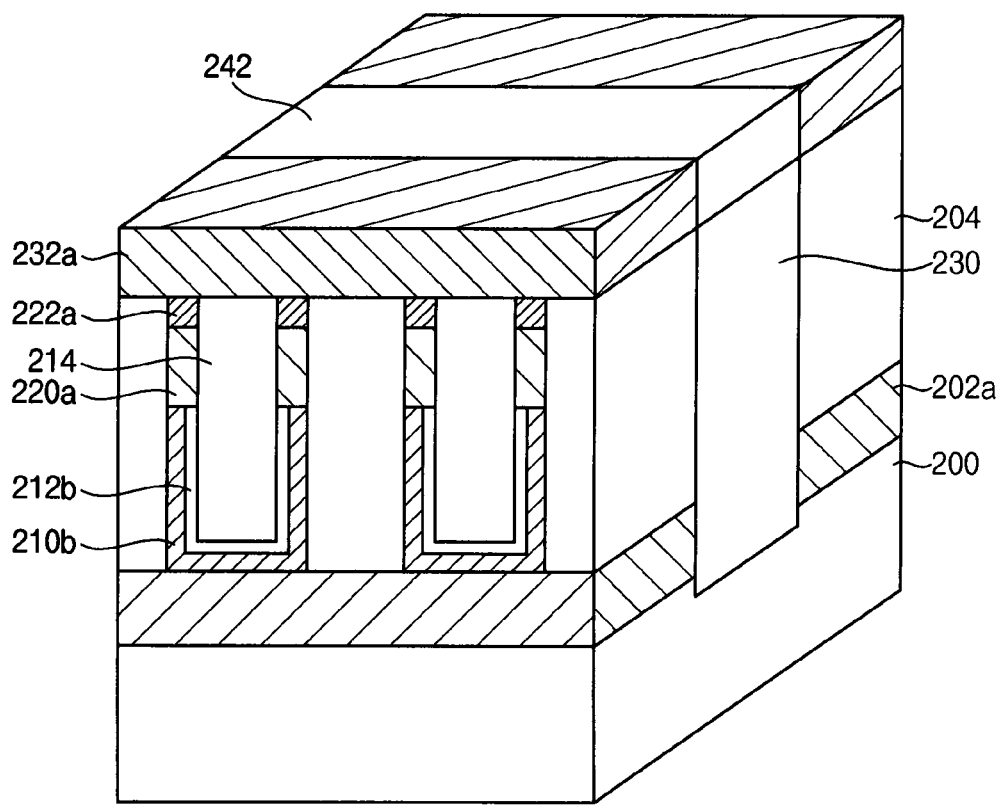
Figure 20:
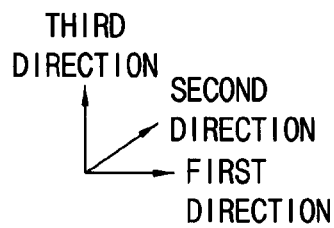
Figure 21:
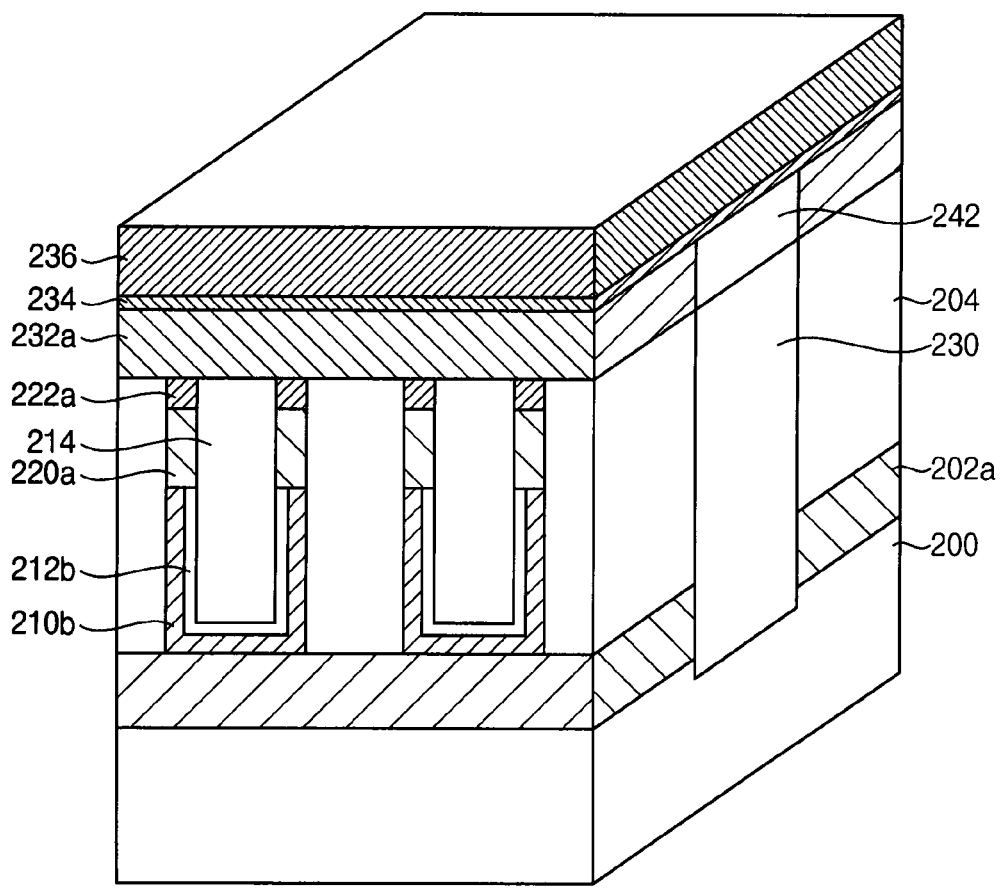

FIGS. 20 and 21 are cross-sectional views illustrating stages of a method of manufacturing a variable resistance memory device in accordance with example embodiments.

Referring to FIG. 20, first, the process described with reference to FIGS. 12 to 16 may be performed. Then, a selection layer 232 (refer to FIG. 17) may be formed on the first to third mold patterns 204, 214, and 230 and the middle electrode 222a.

The selection layer 232 may be patterned to form a preliminary selection pattern 232a extending lengthwise in the first direction. Then, an insulation pattern 242 may be formed in a trench formed between the preliminary selection patterns 232a.

Referring to FIG. 21, a threshold voltage control layer 234 and an upper electrode layer 236 may be formed on the preliminary selection pattern 232a and the insulation pattern 242.

Referring to FIG. 19 again, a second conductive layer may be formed on the upper electrode layer 236. The second conductive layer, the upper electrode layer 236, the threshold voltage control layer 234, the preliminary selection pattern 232a, and the insulation pattern 242 may be patterned to form a pattern structure extending in the second direction. Thus, the selection pattern 232b may be formed to have a pillar shape. A threshold voltage control pattern 235, an upper electrode 237, and a second conductive line (not shown) extending in the second direction may be formed on the selection pattern 232b.

As described above, the semiconductor device may be applied to a high integrated variable resistance memory device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A variable resistance memory device, comprising:
a plurality of stacked structures on a substrate, each of the stacked structures including:
a lower electrode;
a variable resistance pattern on the lower electrode;
a middle electrode on the variable resistance pattern; and
a selection pattern on the middle electrode;
a threshold voltage control pattern on the stacked structures, the threshold voltage control pattern extending in a second direction parallel to an upper surface of the substrate and configured to either increase or decrease a threshold voltage of each selection pattern;
an upper electrode on the threshold voltage control pattern and extending lengthwise in the second direction, so that it has a length greater in the second direction than in a first direction perpendicular to the second direction;
a first conductive line contacting respective lower surfaces of the lower electrodes of the stacked structures and extending in the first direction; and
a second conductive line contacting an upper surface of the upper electrode, the second conductive line extending lengthwise in the second direction, so that it has a length greater in the second direction than in the first direction,
wherein at least one of the middle electrode and the upper electrode includes a conductive material including carbon.

2. The variable resistance memory device of claim 1, wherein the selection pattern includes an ovonic threshold switch (OTS) material including germanium (Ge), silicon (Si), arsenic (As), and tellurium (Te).

3. The variable resistance memory device of claim 1, wherein the threshold voltage control pattern includes a transition metal oxide or an oxide of a rare earth element.

4. The variable resistance memory device of claim 3, wherein the threshold voltage control pattern includes a metal oxide that increase a threshold voltage of the selected pattern, and
wherein the metal oxide includes at least one of aluminum oxide, niobium oxide, titanium oxide, tantalum oxide, cadmium oxide and chromium oxide.

5. The variable resistance memory device of claim 3, wherein the threshold voltage control pattern includes a metal oxide that decrease a threshold voltage of the selected pattern, and
wherein the metal oxide includes at least one of lanthanum oxide, yttrium oxide, cerium oxide, scandium oxide, strontium oxide and erbium oxide.

6. The variable resistance memory device of claim 1, wherein at least one of the middle electrode and the upper electrode includes one of C, CN, TiCN and TaCN.

7. The variable resistance memory device of claim 1, further comprising:
a third conductive line on the first conductive line,
wherein the stacked structures includes a first stacked structure and a second stacked structure adjacent to the first stacked structure in the first direction, and
wherein the first and second stacked structures are electrically connected to each other through the third conductive line.

8. The variable resistance memory device of claim 1, wherein the variable resistance pattern includes a phase change material.

9. A variable resistance memory device, comprising:
a plurality of structures on a substrate, each of the structures including:
a first electrode;
a variable resistance pattern on the first electrode;
a selection pattern on the variable resistance pattern; and
a threshold voltage control pattern contacting at least one of an upper surface and a lower surface of the selection pattern and configured to either increase or decrease a threshold voltage of the selection pattern;
a second electrode on the structures and extending lengthwise in a second direction parallel to an upper surface of the substrate, so that it has a length greater in the second direction than in a first direction perpendicular to the second direction;
a first conductive line contacting respective lower surfaces of the first electrodes of the structures and extending in the first direction; and
a second conductive line contacting an upper surface of the second electrode, the second conductive line extending lengthwise in the second direction, so that it has a length greater in the second direction than in the first direction,
wherein the threshold voltage pattern consists of a single layer in a vertical direction.

10. The variable resistance memory device of claim 9, wherein the selection pattern includes an ovonic threshold switch (OTS) material including germanium (Ge), silicon (Si), arsenic (As), and tellurium (Te).

11. The variable resistance memory device of claim 9, wherein the threshold voltage control pattern includes a transition metal oxide or an oxide of a rare earth element.

12. The variable resistance memory device of claim 9, further comprising:
a third electrode contacting a lower surface of the selection pattern,
wherein the third electrode includes a conductive material including carbon.

13. The variable resistance memory device of claim 12, wherein the threshold voltage control pattern is disposed between the selection pattern and at least one of the second electrode and the third electrode.

14. The variable resistance memory device of claim 12, wherein at least one of the second electrode and the third electrode includes one of C, CN, TiCN and TaCN.

15. The variable resistance memory device of claim 9, further comprising:
a third conductive line on the first conductive line,
wherein the structures includes a first structure and a second structure adjacent to the first structure in the first direction, and
wherein the first and second structures are electrically connected to each other through the third conductive line.

16. The variable resistance memory device of claim 9, wherein the second electrode contacting the threshold voltage control pattern includes a conductive material including carbon.

17. A variable resistance memory device, comprising:
a plurality of structures on a substrate, each of the structures including:
a lower electrode;
a selection pattern on the lower electrode;
a threshold voltage control pattern contacting at least one of an upper surface and a lower surface of the selection pattern and configured to either increase or decrease a threshold voltage of the selection pattern; and
a variable resistance pattern on the selection pattern;
an upper electrode on the structures, the upper electrode extending lengthwise in a second direction parallel to an upper surface of the substrate, so that it has a length greater in the second direction than in a first direction perpendicular to the second direction;
a first conductive line contacting respective lower electrodes of the structures and extending in first direction; and
a second conductive line on the upper electrode, the second conductive line extending lengthwise in the second direction, so that it has a length greater in the second direction than the first direction,
wherein the lower electrode includes a conductive material including carbon, and
wherein a thickness of the threshold voltage control pattern is less than a thickness of the selection pattern.

18. The variable resistance memory device of claim 17, further comprising:
a third conductive line on the first conductive line,
wherein the structures includes a first structure and a second structure adjacent to the first structure in the first direction, and
wherein the first and second structures are electrically connected to each other through the third conductive line.

19. The variable resistance memory device of claim 17, wherein the threshold voltage control pattern includes a transition metal oxide or an oxide of a rare earth element.

20. The variable resistance memory device of claim 17, further comprising:
a middle electrode contacting an upper surface of the selection pattern,
wherein the middle electrode includes a conductive material including carbon.

* * * * *